(12) United States Patent
Maeda et al.

(10) Patent No.: US 6,521,150 B1
(45) Date of Patent: Feb. 18, 2003

(54) METHOD FOR PRODUCING AN ELECTROMAGNETIC WAVE ABSORBING THERMOCONDUCTIVE SILICONE GEL MOLDED SHEET

(75) Inventors: Takako Maeda, Gifu (JP); Mitsuhiro Fujimoto, Aichi (JP)

(73) Assignee: Fuji Polymer Industries Co., Ltd., Aichi (JP)

( * ) Notice: Subject to any disclaimer, the term of this patent is extended or adjusted under 35 U.S.C. 154(b) by 235 days.

(21) Appl. No.: 09/616,316

(22) Filed: Jun. 9, 2000

Related U.S. Application Data

(62) Division of application No. 09/267,049, filed on Mar. 12, 1999, now Pat. No. 6,284,363.

(30) Foreign Application Priority Data

Mar. 23, 1998 (JP) .............................................. 10-74717

(51) Int. Cl.[7] .......................... B29C 43/18; B32B 3/10; H01B 1/20
(52) U.S. Cl. .................. 264/102; 264/257; 264/272.11; 264/279.1; 264/299; 264/324
(58) Field of Search ................................ 264/101, 102, 264/257, 263, 279.1, 299, 272.11, 324

(56) References Cited

U.S. PATENT DOCUMENTS

| | | |
|---|---|---|
| 4,003,840 A | 1/1977 | Ishin et al. |
| 5,014,777 A | 5/1991 | Sano |
| 5,310,598 A | 5/1994 | Yohinaka et al. |
| 5,366,664 A | 11/1994 | Varadan et al. |

FOREIGN PATENT DOCUMENTS

| | | |
|---|---|---|
| EP | 0 785 557 A1 | 7/1997 |
| JP | 57-129003 | 8/1982 |
| JP | 58-004205 A | 1/1983 |
| JP | 2-082559 | 3/1990 |
| JP | 2-166755 | 6/1990 |
| JP | 2-196453 | 8/1990 |
| JP | 3-48500 | 3/1991 |
| JP | 4-234103 | 8/1992 |
| JP | 6-155517 | 6/1994 |
| JP | 7-249888 | 9/1995 |

*Primary Examiner*—Stefan Staicovici
(74) *Attorney, Agent, or Firm*—Merchant & Gould P.C.

(57) ABSTRACT

A silicone gel sheet is heat-molded from a silicone gel composition comprising metal oxide magnetic particles and a thermoconductive filler. The sheet has a high electromagnetic wave absorbing property at a frequency ranging from 500 to 800 MHz. The hardness of the composition after hardening treatment is set in the range of 10–95 when measured with an ASKER F-type hardness meter. The metal oxide magnetic particles used here can be either Mn—Zn ferrite or Ni—Zn ferrite whose average particle diameter is 1–50 μm. For the thermoconductive filler, a metal oxide, aluminum nitride, boron nitride, silicon nitride, or silicon carbide can be used. In the silicone gel molded sheet, an electroconductive mesh is embedded in one surface layer of the silicone gel layers while the other surface is provided with adhesiveness. As a result, an electromagnetic wave absorbing thermoconductive silicone gel molded sheet is provided at a low cost, and the sheet is superior both in electromagnetic wave absorbing property and thermoconductivity.

8 Claims, 3 Drawing Sheets

METHOD FOR PRODUCING AN ELECTROMAGNETIC WAVE ABSORBING THERMOCONDUCTIVE SILICONE GEL MOLDED SHEET

This application is a divisional of application Ser. No. 09/267,049, filed Mar. 12, 1999, now U.S. Pat. No. 6,284,363 which application(s) are incorporated herein by reference.

FIELD OF THE INVENTION

This invention relates to an electromagnetic wave absorbing thermoconductive silicone gel molded sheet. More specifically, this invention relates to an electromagnetic wave absorbing thermoconductive silicone gel molded sheet used for absorbing electromagnetic wave noise of an exoergic electronic part and the like, and for radiating heat.

BACKGROUND OF THE INVENTION

Recently-developed electronic apparatuses such as computers, personal computers and television sets generate various electromagnetic wave noises of high frequencies, and cause problems of electromagnetic interference (EMI). To solve such problems, techniques for absorbing electromagnetic waves from electronic parts of the electronic apparatuses have been searched.

Various techniques have been disclosed, including Unexamined Published Japanese Patent Application (Tokkai-Sho) No. 50-155999, wherein electromagnetic waves are absorbed by a composite comprising metal magnetic particles and resin. Such an electromagnetic wave absorber, however, does not have sufficient absorbency, and thus, sufficient effects cannot be obtained when the absorber is attached to an electronic part that generates electromagnetic waves.

Another disclosure is an electromagnetic wave absorbing sheet comprising a resin layer filled with metal oxide magnetic particles formed on an electroconductive material (Tokkai-Sho 57-129003, Tokkai-Hei 4-234103, and Tokkai-Hei 7-249888). The sheet decays electromagnetic waves by reflecting some of the electromagnetic wave and absorbing other parts thereof. The complicated structure of the sheet, however, raises the production cost. Moreover, the applicable temperature range is narrow because the heat resistance of the resin is low.

Thermoconductive sheets have been disclosed as a part of cooling systems for heat-radiation in exoergic electronic parts of electronic apparatuses (Tokkai-Hei 2-166755, Tokkai-Hei 2-196453, and Tokkai-Hei 6-155517). Many exoergic electronic parts, however, simultaneously have electromagnetic interference caused by electromagnetic wave noise. In such a case, a shielding material, other than the thermoconductive sheet, is used to absorb electromagnetic waves. Since plural kinds of parts are necessary, the cost will increase.

SUMMARY OF THE INVENTION

In order to solve the above-mentioned problems, this invention provides an electromagnetic wave absorbing thermoconductive silicone gel molded sheet that has a high electromagnetic wave absorbing property and thermoconductivity at a low cost.

An electromagnetic wave absorbing thermoconductive silicone gel molded sheet to achieve the purpose is formed from silicone gel comprising metal oxide magnetic particles and a thermoconductive filler.

The sheet of this invention has a high electromagnetic wave absorbing property and thermoconductivity compared to a combined use of a conventional electromagnetic wave absorbing sheet and a radiation sheet, since the sheet of this invention comprises metal oxide magnetic particles and a thermoconductive filler. The reason can be explained as follows. When electromagnetic energy is absorbed in an electromagnetic wave absorbing sheet, it is converted into heat energy usually. As the sheet of this invention has thermoconductivity, the heat energy is transferred rapidly in the sheet and radiated. Therefore, the sheet of this invention rapidly converts electromagnetic energy into heat energy and thus, demonstrates a high electromagnetic wave absorbing property. As a result, the sheet of this invention can be used alone because of its electromagnetic wave absorbing property and thermoconductivity. The simple structure and low cost also contribute to its usefulness. In addition, the sheet of this invention can be used in a wide temperature range since the silicone gel resists to higher temperature compared to other organic plastics, and it is excellent in thermostability.

It is preferable in the sheet that a sheet of an electroconductive reinforcement is embedded in at least either an upper or lower surface of the silicone gel molded sheet, since a higher electromagnetic wave absorbing property is obtained. An electromagnetic wave entering the sheet is reflected by the electroconductive sheet and passed through the sheet again to provide the above-mentioned actions and effects. In other words, electromagnetic energy will be converted into heat energy when it is absorbed in the electromagnetic wave absorbing sheet. In the sheet of this invention, provided with thermoconductivity, the heat energy is transferred rapidly in the sheet and radiated. As a result, electromagnetic energy is soon converted into heat energy in the sheet of this invention, and demonstrates a high electromagnetic wave absorbing property. For this reason, the electromagnetic energy is converted into heat energy again with efficiency.

Although the electromagnetic wave absorbing thermoconductive silicone gel molded sheet has low hardness and less strength, the embedded electroconductive reinforcement reinforces the sheet, and thus, the operability in amounting step is improved.

A method for producing an electromagnetic wave absorbing thermoconductive silicone gel molded sheet of this invention comprises the steps of:

adding metal oxide magnetic particles and a thermoconductive filler to a silicone gel and mixing them to prepare a mixture of a uniform composition;

degassing the mixture with a deaerator;

vertically sandwiching the degassed mixture with supporting films of a predetermined shape; and press-molding the mixture while heating to harden the mixture to be a sheet. A silicone gel molded sheet of this invention can be produced rationally and efficiently in this method.

In the above-mentioned method, the step of sandwiching the degassed silicone gel mixture vertically with the supporting films of a predetermined shape is preferably carried out by:

placing an unhardened silicone gel blended with metal oxide magnetic particles and a thermoconductive filler on a lower supporting film of a predetermined shape;

covering the silicone gel with a sheet of electroconductive reinforcement and an upper supporting film; and embedding the sheet of electroconductive reinforcement in the silicone gel.

As a result, the silicone gel molded sheet in which the electroconductive reinforcement is embedded can be produced efficiently and rationally.

DETAILED DESCRIPTION OF THE PREFERRED EMBODIMENT

Figure 1:
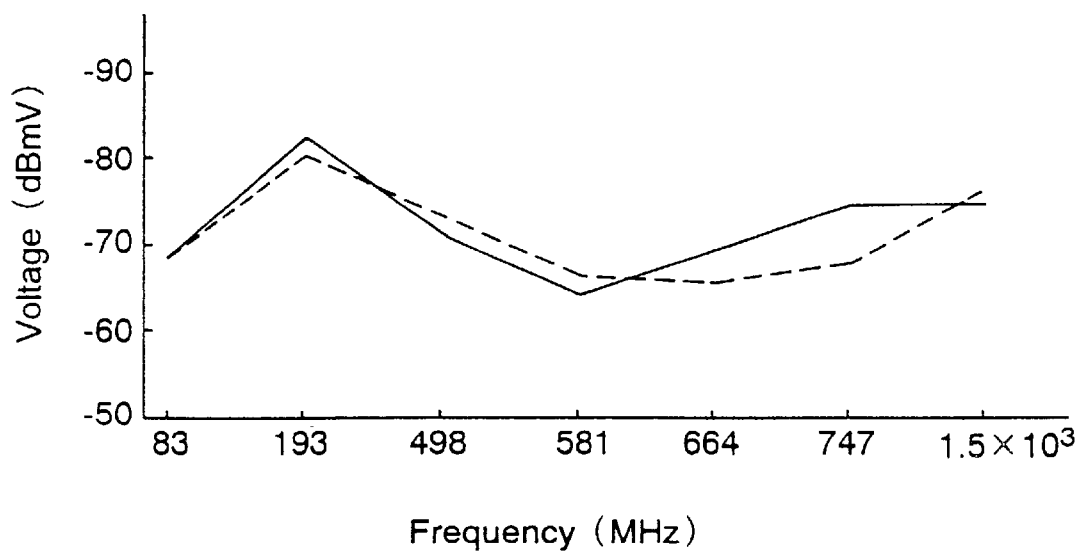
FIG. 1 is a graph to show the measurement on a conductive noise for a sheet in Example 1 of this invention.

The voltage attenuation for a 1 mm-thick molded sheet of this invention is preferably 10 dB or more at a frequency in a range of 10–1000 MHz, since attenuation of at least 10 dB means a practical level as the electromagnetic wave absorbing property.

The hardness of the sheet, measured with an ASKER F-type hardness meter, is preferably 10–95, more preferably, 30–70. Such a sheet with 10–95 hardness can be adhered well to an exoergic electronic part. Since sufficient adhesiveness further increases the thermoconductive area of the sheet, the heat radiation efficiency is improved. Moreover, if the hardness is set lower, the compressive load can be decreased. The "hardness" here relates to a silicon gel comprising metal oxide magnetic particles and a thermoconductive filler, which is molded into a sheet and hardened. In this invention, the hardness is measured in the following manner.

The above-mentioned silicone gel molded sheet or a sample piece of the same sheet is arranged horizontally. A measurer keeps the ASKER F-type hardness meter vertically by hand, and quietly places the hardness meter on the surface of the sheet or sample, making the surface of the sheet and the pressurizing surface of the meter substantially parallel. Then, the measurer takes his hand off to leave the meter on the sheet. The maximum value of the hardness meter equals to the hardness of the molded sheet. The hardness meter, weighing about 500 g, measures the hardness by using its own weight as the measuring pressure. The sheet or sample to be measured should be larger than the surface area of the pressurizing surface and thicker than 25 mm. For example, a sheet or sample with 100 mm in length, 100 mm in width and 25 mm in thickness can be used for the measurement.

Preferably in the sheet, at least one surface of the sheet is adhesive, so that the sheet surface can be adhered well with an exoergic electronic part, and thus, sufficient thermoconductive area is kept. As a result, both the thermoconductivity and electromagnetic wave absorbing property will be improved further. The adhesiveness is a property inherent in a heat-molded silicone gel.

Preferably in the sheet, the metal oxide magnetic particles are formed from at least one magnetic material selected from the group consisting of Mn—Zn ferrite and Ni—Zn ferrite. Mn—Zn ferrite is particularly preferred. The metal oxide magnetic material is not limited to one of the above-mentioned ferrites, but two or more kinds of metal oxide magnetic materials can be used at the same time.

In the sheet, the average particle diameter of the metal oxide magnetic particles ranges preferably from 1 to 50 $\mu$m, more preferably, from 1 to 20 $\mu$m. The average particle diameter here means weight average particle diameter.

In the sheet, the thermoconductive filler is preferably at least one material selected from the group consisting of metal oxides, aluminum nitride, boron nitride, silicon nitride, and silicon carbide. Among them, a metal oxide is the specifically preferable for lowering the cost. The metal oxides include aluminum oxide, magnesium oxide, zinc oxide, and titanium oxide. Aluminum oxide is preferred specifically. The thermoconductive filler is not limited to one of the above-mentioned materials, but two or more kinds can be used at the same time.

Preferably in the sheet, the total weight of the metal oxide magnetic particles and the thermoconductive filler is at least 400 parts by weight, more specifically, 400–600 parts by weight to 100 parts by weight of the silicone gel, and the weight ratio of the metal oxide magnetic particles (X) to the thermoconductive filler (Y) is in the range represented by the equation of X:Y=2:1 to 1:2. The most preferable weight ratio is 1:1.

It is preferable that the sheet of an electroconductive reinforcement embedded in at least either upper or lower surface layer of the silicone gel molded sheet comprises a network structure of fibers provided by coating an electroconductive metal on at least one kind of fibers selected from the group consisting of synthetic fibers, natural fibers and inorganic fibers. The electroconductive metal coating can be formed, for example, by plating, evaporation, or by sputtering. The synthetic fibers include polyester fibers, heat-resisting nylon fibers, aramid fibers, polyolefin fibers and vinylon fibers. The natural fibers include cotton and linen. The inorganic fibers include carbon fibers and glass fibers. The electroconductive materials used for plating are metals such as copper, nickel, gold, silver, zinc and aluminum. The metal is not limited only one kind, but two or more metals can be used at the same time.

A sheet of this invention can be produced as follows.

Metal oxide magnetic particles and a thermoconductive filler are added to a silicone gel and stirred to be uniform. This mixture is degassed with a deaerator. Subsequently the mixture is sandwiched vertically with supporting films of a predetermined shape, and press-molded with heat to be hardened.

During the molding step, the unhardened silicone gel blended with metal oxide magnetic particles and a thermoconductive filler is placed on a lower supporting film of a predetermined shape, which is covered with a sheet of electroconductive reinforcement and an upper supporting film. Then, the sheet of electroconductive reinforcement is embedded in the silicone gel and the silicone gel is hardened by press-molding with heat.

Though there is no special imitation for the silicone gel, an addition reaction or a condensation reaction silicone gel, for example, can be used. Addition reaction silicone gel is preferred.

The typical temperature condition for the press-molding ranges from 80 to 120° C. to harden the mixture, though the condition is determined properly depending on the composition of the mixture. The typical pressure condition for the press-molding ranges from 30 to 150 kgf/cm$^2$, though it is determined properly depending on the composition of the mixture, and the range preferable to prevent air bubbles is from 50 to 80 kgf/cm$^2$. The time for the press-molding is typically from 2 to 10 minutes though it is determined properly depending on the composition of the mixture, the temperature condition and the pressure condition.

For the supporting film, a resin film or the like can be used. For example, a polyethylene terephthalate (PET) film, a polypropylene (PP) film or a polyethylene (PE) film can be used preferably. The most preferable film is a PET film. In general, the supporting film is removed after press-molding.

The supporting film is preferably 25–250 μm in thickness, more preferably, 50–150 μm.

The press-molding for forming the sheet can be replaced by, for example, coating, calendering, and rolling.

The sheet of this invention is preferably 0.2–5 mm in thickness, more preferably, 0.5–3 mm in thickness.

The sheet of this invention can comprise other ingredients than the metal oxide magnetic particles and the thermoconductive filler, such as an adhesive, a reinforcer, a colorant, a heat resistance improver and an adhesive auxiliary. The percentage is not specifically limited as long as it has no adverse effects on the sheet's properties.

Examples of this invention are described below, along with a Comparative Example. The measurements of respective properties of the silicone gel molded sheets in the Examples and Comparative Example are as follows.

(1) Specific Gravity

The specific gravity was measured by an underwater substitution according to the procedure described in JIS K 7112. Samples (0.5–5 gf) tied with a metal wire of no more than 0.1 mm in diameter and weighed accurately in the air at 23° C. were introduced in distilled water in a beaker set at 23° C. to weigh in water, and the specific gravity (S) was calculated by the following Equation 1. In the Equation 1, "a" refers to the samples' weight in the air, and "b" refers to the same weight in the water.

$$S=a/(a-b) \quad \text{Equation 1}$$

(2) Hardness

Sample sheets (100×100×25 mm) for testing were prepared in the same manner as the Examples and the Comparative Example, and the hardness was measured in the above-mentioned manner by using an ASKER F-type hardness meter supplied by KOBUNSHI KEIKI CO., LTD.

(3) Electric Volume Resistance

Electric volume resistance (unit: Ω·cm) was measured according to the procedure described in JIS C 2123.

(4) Heat Resistance

The samples prepared in the Examples and Comparative Example were sandwiched between a transistor (TO-3 model) and a heat sink. They were weighted with 2 kg, while 20 w electric power was applied to the transistor. The transistor temperature (TC, unit:° C.) and heat sink temperature (TF, unit:° C.) were measured respectively after three minutes by using temperature sensors attached to predetermined positions in order to calculate the heat resistance (θ, unit: ° C./w) by the following Equation 2.

$$\theta=(TC-TF)/20 \quad \text{Equation 2}$$

(5) Conductive Noise

The samples prepared in the Examples and Comparative Example were inserted between a central processing unit (CPU) and a radiator plate for a measurement on terminal conductive noises. A voltage at a specific frequency of signals transmitted from the CPU was read with a spectrum analyzer in order to see the fluctuation of the voltage.

(6) Electromagnetic Wave Absorbing Property

Electromagnetic wave absorbing property (unit: dB) was measured according to MIL-STD-285. MIL-STD means Military Standard, the international standard in the United States, and MIL-STD-285 means the Shielded Room Test Method. The measurement was carried out in the range of 10 MHz–1000 MHz by using a 492-model spectrum analyzer supplied by Tektronix.

(7) Electromagnetic Wave Shielding Property

Transmission attenuation was measured in the range from 10 MHz to 1000 MHz by using an electromagnetic wave shielding property analyzer supplied by Incorporated Association of Kansai Electronic Industry Development Center.

EXAMPLE 1

In this Example, 100 parts by weight of a silicone gel, 250 parts by weight of metal oxide magnetic particles, and 250 parts by weight of a thermoconductive filler were mixed and stirred with an agitator to be uniform. The silicone gel used here was an addition reaction silicone gel supplied by Toshiba Silicone Co., Ltd., and the metal oxide magnetic particles were Mn—Zn ferrite with 3 μm in weight average particle diameter (supplied by Toda Kogyo Corp.) The thermoconductive filler was spherical alumina of 37 μm in weight average particle diameter (supplied by Showa Denko K. K.) After removing air bubbles from the composition by using a deaerator, the composition was sandwiched by 100 μm-thick PET films, pressurized at 80 kgf/cm², and heated at 120° C. for five minutes for press-molding.

As a result, a silicone gel molded sheet of 1 mm in thickness was obtained. The measurement result of the electromagnetic wave absorbing property of the sheet is shown in Table 1 below. The measurement result of some other properties is shown in the following Table 2. The solid line in FIG. 1 indicates the relationship between the frequency as an evaluation of the conductive noise of the sheet and the voltage.

TABLE 1

| | 10 MHz–1000 MHz | |
|---|---|---|
| Example 1 | −20 dB | −20 dB |

As shown in Table 1, the constant value of −20 dB was maintained in the range of 10–1000 MHz in Example 1 of this invention. On the other hand, the electromagnetic wave absorbing property of the disclosed conventional techniques was about −10 dB in the frequency range of 10–1000 MHz.

EXAMPLE 2

As in Example 1, an unhardened silicone gel composition was prepared by blending with metal oxide magnetic particles and a thermoconductive filler. After removing bubbles from the composition by using a deaerator, the composition was placed on a PET film, and an electroconductive mesh supplied by Seiren Co., Ltd. (trade name is Plat SE200) was placed subsequently. The electroconductive mesh is a network whose weight is 24.3 g/m² and thickness is 0.25 mm, made of polyester fibers with 10 μm diameter coated with about 0.2 μm-thick nickel by electroless plating. After coating a 100 μm-thick PET film thereon, the object was heated for five minutes at 120° C. for press-molding.

As a result, a silicone gel molded sheet of 1 mm thickness was obtained. The measurement result of the electromagnetic wave absorbing property of the sheet is shown in Table 2 below. The measurement result of some other properties is shown in the following Table 3. The solid line in FIG. 2 indicates the evaluation for the electromagnetic wave shielding property of the sheet. The electromagnetic wave shielding property is represented as the relationship between the frequency and the transmission attenuation. The broken line in FIG. 2 indicates the result of the measurement restricted to the electroconductive reinforcement.

Figure 3:
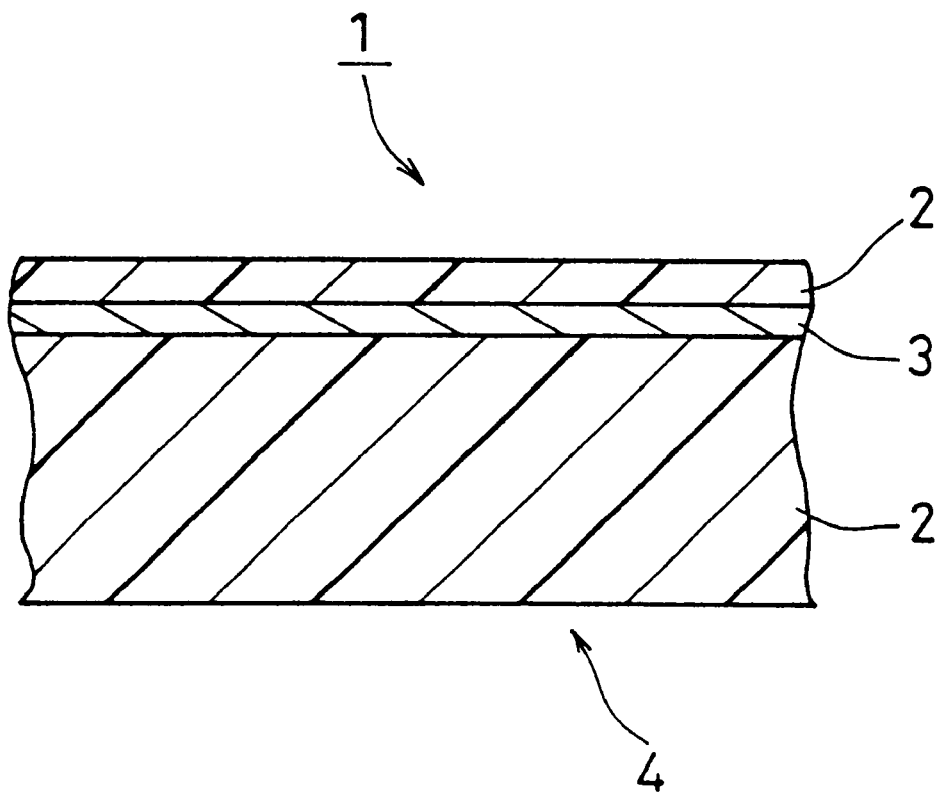
FIG. 3 is a schematic cross-sectional view of the sheet obtained in Example 2.

FIG. 3 is a schematic cross-sectional view of the silicone gel molded sheet 1 obtained in Example 2. An electroconductive mesh 3 is embedded in one surface layer of a silicone gel layer 2, while an adhesive surface 4 is formed on the other side. The adhesiveness is inherent in the heat-molded silicone gel.

Comparative Example 1

A mixture of 100 parts by weight of a silicone gel and 550 parts by weight of Mn—Zn ferrite was prepared. Using this mixture, a silicone gel molded sheet of 1 mm in thickness was produced as in Example 1. The measurement result of the properties of the sheet is shown in Table 2 below. The broken line in the graph of FIG. 1 shows the relationship between the frequency as an evaluation of the conductive noise of the sheet and the voltage.

TABLE 2

|  | Example 1 | Example 2 | Comparative Example 1 |
| --- | --- | --- | --- |
| Specific gravity | 2.7 | 2.7 | 3.0 |
| Hardness | 56 | 56 | 48 |
| Electric volume resistance ($\times 10^{13} \Omega \cdot$ cm) | 0.1 | 0.1 | 1.2 |
| Heat resistance (° C./w) | 1.3 | 1.3 | 1.7 |

Figure 2:
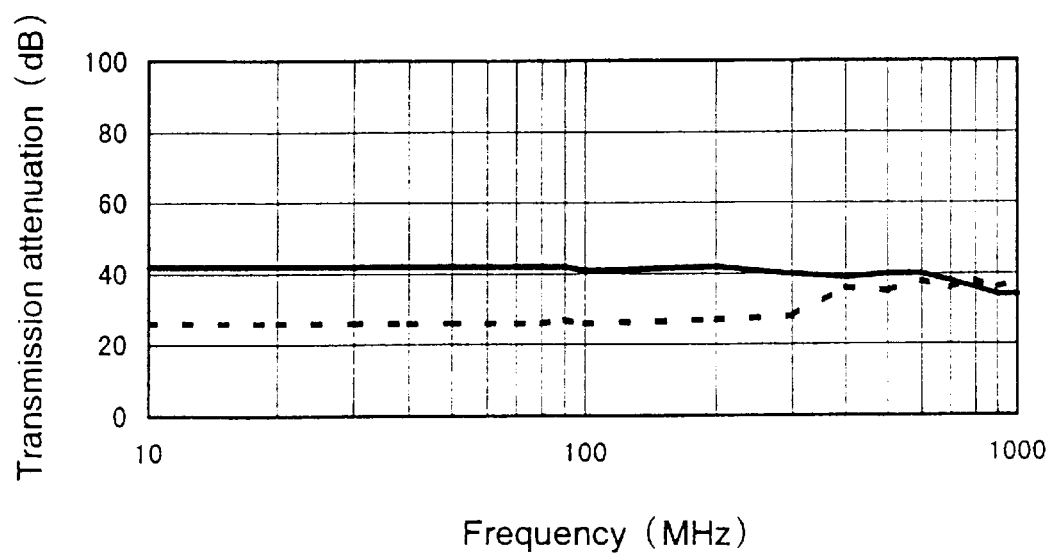
FIG. 2 is a graph to show the measurement on the electromagnetic wave shielding property for a sheet in Example 2 of this invention.

As clearly demonstrated in the above Examples and Comparative Example, the sheets of Examples 1 and 2 of this invention had lower heat resistance compared to that of Comparative Example 1 comprising only metal oxide magnetic particles, as shown in the above Table 2. This means that Examples 1 and 2 provided silicone gel molded sheets with higher thermoconductivity compared to Comparative Example 1. Moreover, as shown in FIG. 1, the conductive noise of the sheet in Example 1, is considerably distinguishable from that of Comparative Example in the frequency range from 500 to 800 MHz. This indicates the excellent electromagnetic wave absorbing property of the former sheet. As shown in Table 2, the sheet of Example 1 demonstrated a high electromagnetic wave absorbing property in the frequency range from 10 MHz to 1000 MHz. Furthermore, as shown in FIG. 2, the electromagnetic wave shielding property of the sheet in Example 2 was far superior to conventional techniques.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A method for producing an electromagnetic wave absorbing thermoconductive silicone gel molded sheet comprising metal oxide magnetic particles and a thermoconductive filler, comprising the steps of:

adding metal oxide magnetic particles and a thermoconductive filler, wherein the metal oxide magnetic particles are at least one kind of magnetic material selected from the group consisting of Mn—Zn ferrite and Ni—Zn ferrite, to a silicone gel and mixing to form a mixture of a uniform composition;

degassing the mixture with a deaerator;

sandwiching the degassed mixture vertically with supporting films of a predetermined shape; and hardening the mixture by press-molding while heating to form a 1 mm thick sheet having a voltage attenuation of at least 10 dB at a frequency in the range of 10–1000 MHz.

2. The method for producing a silicone gel molded sheet according to claim 1, wherein a the step of sandwiching the degassed silicone gel mixture vertically with supporting films of a predetermined shape is carried out by:

placing an unhardened silicone gel blended with the metal oxide magnetic particles and thermoconductive filler on a lower supporting film of a predetermined shape;

covering the silicone gel with a sheet of electroconductive reinforcement and an upper supporting film; and embedding the sheet of electroconductive reinforcement in the silicone gel.

3. The method for producing a silicone gel molded sheet according to claim 1, wherein the silicone gel is either an addition reaction silicone gel or a condensation reaction silicone gel.

4. The method for producing a silicone gel molded sheet according to claim 1, wherein the hardness of the press-molded silicone gel sheet ranges from 10 to 95 when measured with an ASKER F-type hardness meter.

5. The method for producing a silicone gel molded sheet according to claim 1, wherein the average particle diameter of the metal oxide magnetic particles is from 1 to 50 μm.

6. The method for producing a silicone gel molded sheet according to claim 1, wherein the thermoconductive filler is at least one kind of material selected from the group consisting of a metal oxide, aluminum nitride, boron nitride, silicon nitride, and silicon carbide.

7. The method for producing a silicone gel molded sheet according to claim 1, wherein at least 400 parts by weight of metal oxide magnetic particles and a thermoconductive filler in total to 100 parts by weight of silicone gel are comprised, and the mixture ratio in weight of the metal oxide magnetic particles (X) to the thermoconductive filler (Y) is in the range of X:Y=2:1 to 1:2.

8. The method for producing a silicone gel molded sheet according to claim 2, wherein the electroconductive reinforcement is a network structure formed with fibers prepared by coating an electroconductive metal on at least one kind of fibers selected from the group consisting of synthetic fibers, natural fibers and inorganic fibers.

* * * * *